(12) United States Patent
Tsironis (10) Patent No.: US 11,402,424 B1
(45) Date of Patent: Aug. 2, 2022

(54) LOW PROFILE SLIDE SCREW TUNERS AND METHOD

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 342 days.

(21) Appl. No.: 16/592,058

(22) Filed: Oct. 3, 2019

(51) Int. Cl.
| | |
|---|---|
| *G01R 31/26* | (2020.01) |
| *G01R 31/28* | (2006.01) |
| *H01P 1/22* | (2006.01) |
| *H01P 1/18* | (2006.01) |
| *H01P 3/08* | (2006.01) |

(52) U.S. Cl.
CPC ..... *G01R 31/2601* (2013.01); *G01R 31/2822* (2013.01); *H01P 1/184* (2013.01); *H01P 1/227* (2013.01); *H01P 3/08* (2013.01)

(58) Field of Classification Search
CPC . G01R 31/2601; G01R 31/2822; H01P 1/184; H01P 1/227; H01P 3/08
USPC .................................................... 324/750.01
See application file for complete search history.

(56) References Cited

U.S. PATENT DOCUMENTS

| | | | |
|---|---|---|---|
| 6,674,293 B1 | 1/2004 | Tsironis | |
| 9,257,963 B1 | 2/2016 | Tsironis | |
| 9,602,072 B1 * | 3/2017 | Tsironis | ................... H03H 7/40 |
| 9,899,984 B1 * | 2/2018 | Tsironis | ............. G01R 31/2822 |

OTHER PUBLICATIONS

"Load Pull" [online] Wikipedia, [Retrieved on Aug. 24, 2017], Retrieved from Internet <URL: https://en.wikipedia.org/wiki/Load_pull>.
"Computer Controlled Microwave Tuner, CCMT", Product Note 41, Focus Microwaves Inc. 1998, pp. 2-4.
"Standing wave ratio" [online], Wikipedia, [Retrieved on Feb. 3, 2017]. Retrieved from Internet <URL: https://en.wikipedia.org/wiki/Standing_wave_ratio>.
"MPT, a universal Multi-Purpose Tuner", Product Note 79, Focus Microwaves Inc., Oct. 2004.
"On Wafer Load Pull Tuner Setups: A Design Help", Application Note 48, Focus Microwaves, Dec. 2001, p. 2 ff., Figure 2.
"Probes Selection Guide" [online], FormFactor Inc [Retrieved on Sep. 1, 2019], Retrieved from Internet <URL: https://www.formfactor.com/download/probe-selection-guide/?wpdmdl=2561 &refresh=5d938977cf1031569950071>.
"Nema 8—20×20 mm" stepper motors [online], OMC-Stepperonline [Retrieved on Oct. 1, 2019, Retrieved from Internet <URL: https://www.omc-stepperonline.com/nema-8-stepper-motor/nema-8-bipolare-1-8deg-1-6ncm-2-3oz-in-0-2a-4-8v-20x20x28mm-4-fili.html>.
"Computer controlled microwave tuner CCMT", datasheet, DS-CCMT-4020-V03, Focus Microwaves Group.

* cited by examiner

*Primary Examiner* — Jermele M Hollington
*Assistant Examiner* — Courtney G McDonnough (57) ABSTRACT

A low-profile passive slide screw load pull tuner is used on-wafer, especially in millimeter-wave frequencies from 25 to 110 GHz and above. It uses special rotating tuning probes insertable in a short slabline mounted inside the tuner housing, which holds the control gear. The tuner is mounted at an angle matching the angle of the wafer-probe, is connected directly of the wafer-probe and ensures optimum reflection factor tuning range.

5 Claims, 9 Drawing Sheets

LOW PROFILE SLIDE SCREW TUNERS AND METHOD

PRIORITY CLAIM

Not applicable.

CROSS-REFERENCE TO RELATED ARTICLES

1. "Load Pull" [online] Wikipedia, [Retrieved on 2017 Aug. 24]. Retrieved from Internet <URL: https://en.wikipedia.org/wiki/Load_pull>.
2. "Computer Controlled Microwave Tuner, CCMT", Product Note 41, Focus Microwaves Inc. 1998, pages 2-4.
3. "Standing wave ratio" [online], Wikipedia, [Retrieved on 2017 Feb. 3]. Retrieved from Internet <URL: https://en.wikipedia.org/wiki/Standing_wave_ratio>.
4. Tsironis, U.S. Pat. No. 6,674,293, "Adaptable pre-matched tuner system and method"
5. "MPT, a universal Multi-Purpose Tuner", Product Note 79, Focus Microwaves Inc., October 2004.
6. "On Wafer Load Pull Tuner Setups: A Design Help", Application Note 48, Focus Microwaves, December 2001, page 2 ff., FIG. 2.
7. "Probes Selection Guide" [online], FormFactor Inc [Retrieved on 2019 Sep. 1], Retrieved from Internet <URL: https://www.formfactor.com/download/probe-selection-guide/?wpdmdl=2561&refresh=5d938977cf1031569950071>.
8. C. Tsironis, U.S. Pat. No. 9,257,963, "Impedance tuners with rotating probes".
9. "Nema 8-20×20 mm" stepper motors [online], OMC-Stepperonline [Retrieved on 2019 Oct. 1, Retrieved from Internet <URL: https://www.omc-stepperonline.com/nema-8-stepper-motor/nema-8-bipolare-1-8deg-1-6ncm-2-3oz-in-0-2a-4-8v-20×20×28 mm-4-fili.html>.
10. "Computer controlled microwave tuner CCMT", datasheet, DS-CCMT-4020-V03, Focus Microwaves Group.

BACKGROUND OF THE INVENTION

This invention relates to load and source pull testing of medium and high-power RF transistors and amplifiers using remotely controlled electro-mechanical impedance tuners.

Design of high-power RF amplifiers and mixers, used in various communication systems, requires accurate knowledge of the active device's (typically transistor's) characteristics. In such circuits, it is insufficient for the transistors, which operate in their highly non-linear regime, close to saturation, to be described using only small signal scattering (s-) parameters or non-linear numeric models.

Figure 1:
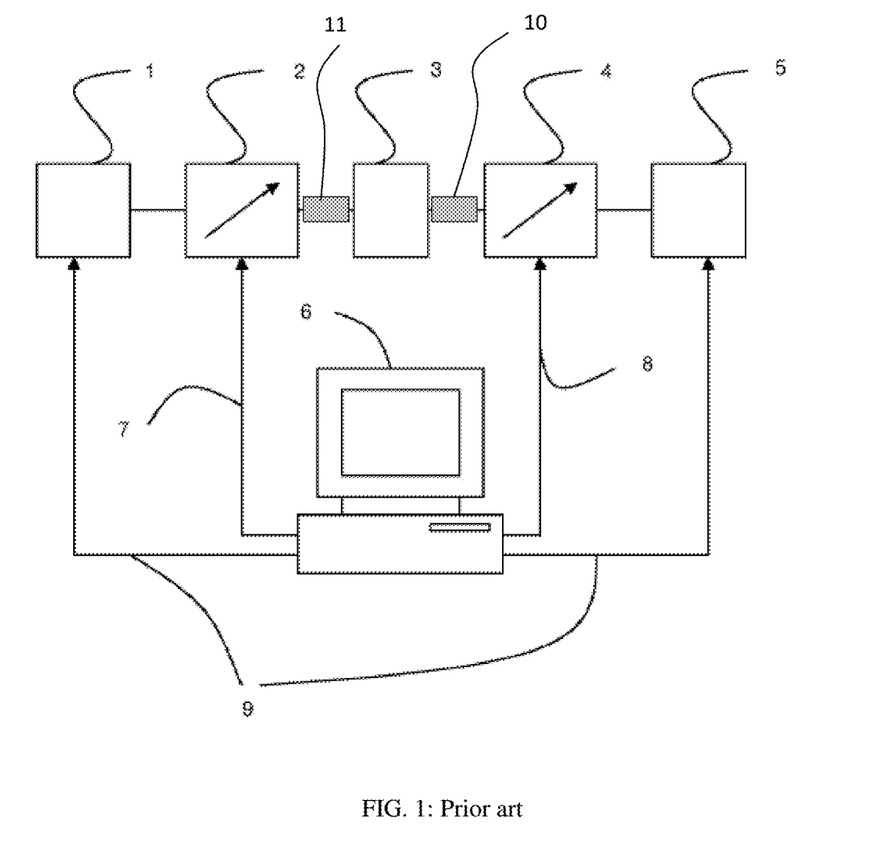
FIG. 1 depicts prior art, a typical automated transistor load pull test system.

A popular method for testing and characterizing such microwave and millimeter-wave transistors in the non-linear region of operation is "load pull" (FIG. 1). Load pull is a measurement technique employing impedance tuners 2, 4 and other test equipment, such as signal sources 1, test fixtures and device under test (DUT) 3 and power meters 5, the whole controlled by a computer 6; the computer controls and communicates with the tuners 2,4 and other equipment 1, 5 using digital cables 7, 8, 9. The tuners are used in order to manipulate the microwave impedance conditions in a systematic and controlled manner under which the DUT is tested (see ref. 1); tuners allow determining experimentally the optimum matching networks for designing amplifiers and other microwave components for specific performance targets, such as gain, efficiency, inter-modulation etc.; this specification refers hence to "tuners" as being "impedance control tuners", in order to separate from "tuned receivers (radios)", commonly referred to also as "tuners", because of the included tuning circuits (see ref. 2).

Figure 2:
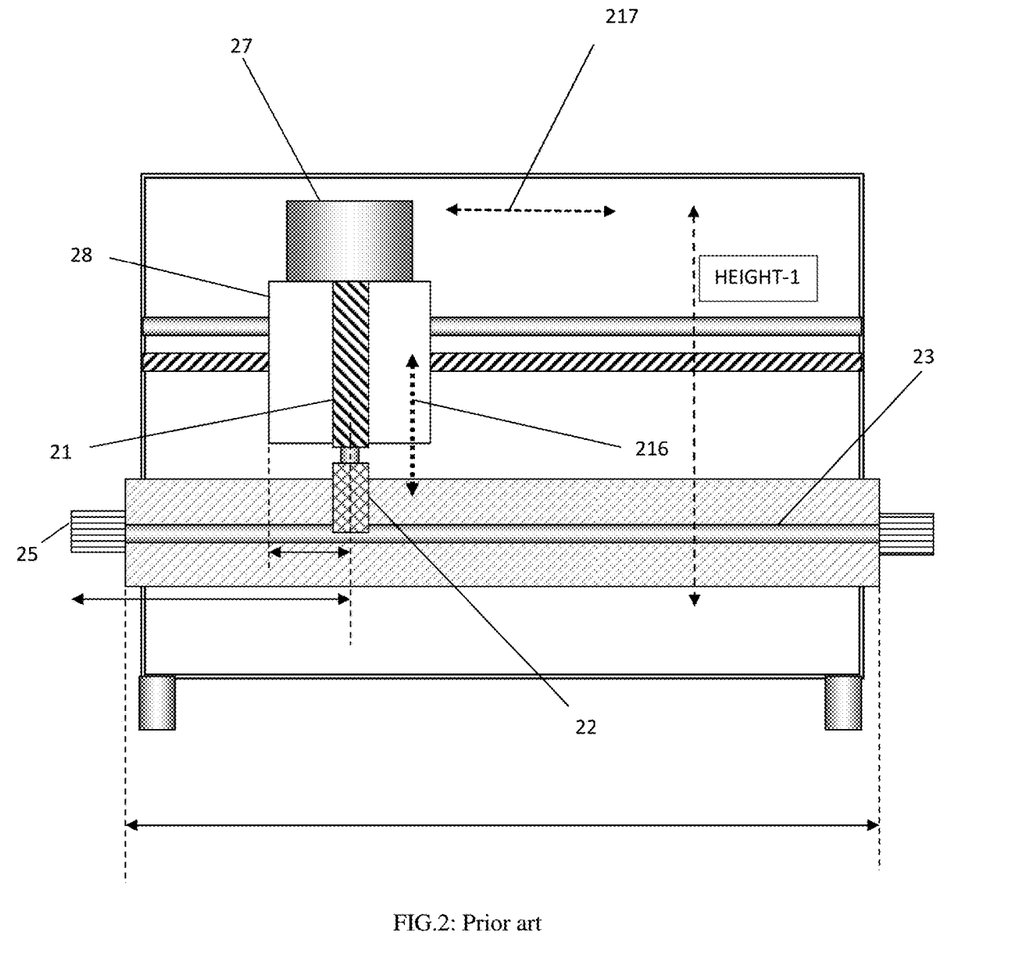
FIG. 2 depicts prior art, a cross section of an automated slide screw impedance tuner using a single vertical axis and RF probe (slug).
Figure 3:
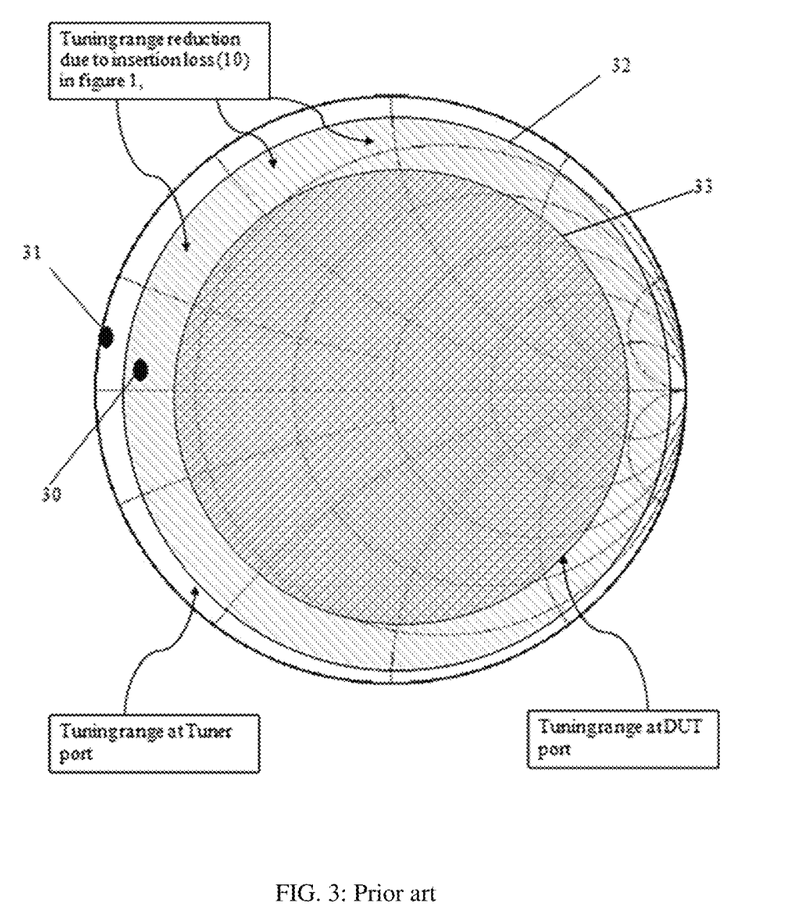
FIG. 3 depicts prior art, effect of insertion loss between tuner and DUT on tuning range.

Impedance tuners use the slide screw concept; they consist, in general, of a low loss transmission line with center conductor 23 and, one or more block-formed (see ref. 4) adjustable tuning probes 22, FIG. 2; the probes (slugs) 22 are attached to a precision vertical axis 21, which is mounted in a mobile carriage 28; the axis 21, controlled by motor 27 can move the probe 22 vertically 216 in Y direction, starting at the top and moving towards the center conductor 23; the carriage 28 can move the probe 22 horizontally 217 (in X direction) either towards or away from the test port 25 (and the DUT, which is attached to the test port) parallel to the center conductor 23. The vertical movement 216 changes the amplitude of the reflection factor, seen at the tuner test port 25, whereas the horizontal movement 217 changes its phase. This way a large portion of Smith chart is covered allowing quasi-infinite impedances from a minimum value Zmin to a maximum value Zmax to be synthesized at any given frequency within the "tuning range" of the tuner. Typical values of state-of the art tuners are $|Zmin|=2\Omega$ and $|Zmax|=1250\Omega$; this corresponds to a Voltage Standing Wave Ratio (VSWR) of 25:1. The relation between reflection factor and impedance is given by $$GAMMA=|GAMMA|*exp(j\Phi)=(Z-Zo)/(Z+Zo) \qquad \{eq.1\},$$

wherein Z is the complex impedance $Z=R+jX$ and Zo is the characteristic impedance. |GAMMA| varies between 0 and 1; a typical value used for Zo is 50Ω (see ref. 3). The higher |GAMMA|, the higher the "tuning range", FIG. 3. The equivalent, offering higher reading resolution both for low and high |GAMMA| is the Voltage Standing Wave Ratio:

$$VSWR=(1+|GAMMA|)/(1-|GAMMA|) \qquad \{eq.2\}$$

which varies between 1 and infinite.

Figure 4:
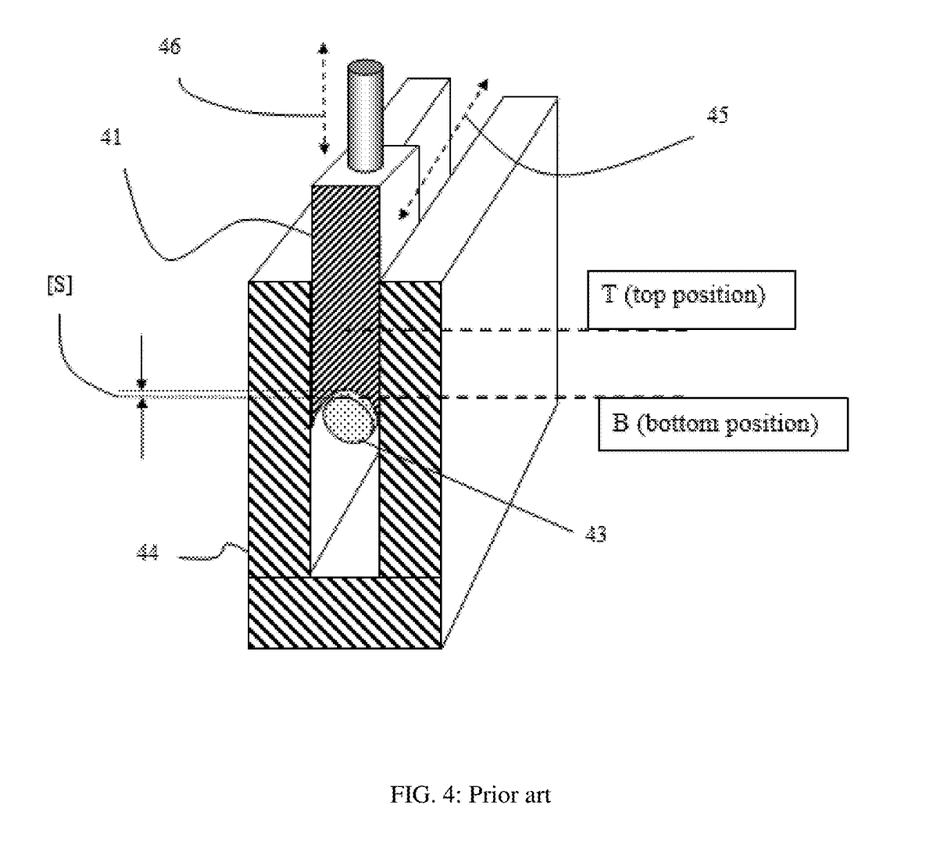
FIG. 4 depicts prior art, a perspective view of the tuning probe inside a slabline.

Metallic probes 22, 41 or "slugs" are made in a parallelepiped form 41 with a concave bottom, which allows to capture, when approaching the center conductor 43, the electric field which is concentrated in the area between the center conductor 43 and the ground planes of the slabline 44 (FIG. 4). This "field capturing" allows creating high and controllable capacitance and reflection factors. The critical part is the required proximity [S] and accuracy of both the vertical 46 and horizontal 45 probe movement, whereby changes in the vertical probe position 46 of a few micrometers affects the VSWR by a large extent. This invention discloses a passive low-profile tuner structure maximizing the tuning range up to 110 GHz.

Insertion losses between the DUT and the tuners 10, 11 reduce the tuning range (FIG. 3). Whereas the original tuning range is high enough, represented by circle 32, and would allow encircling the internal impedance of a medium impedance DUT 30, the insertion loss 10 reduces the tuning range to circle 33, in which case not even this DUT can be matched. If the DUT internal impedance is at spot 31, then even a perfect passive tuner cannot be used, an active injection solution is due. It is a general aim in the technology to minimize this insertion loss 10, 11. This can be done by physically approaching the tuning core of the tuner (i.e. the tuning probe (slug)) to the DUT.

BRIEF SUMMARY OF THE INVENTION

Figure 5:
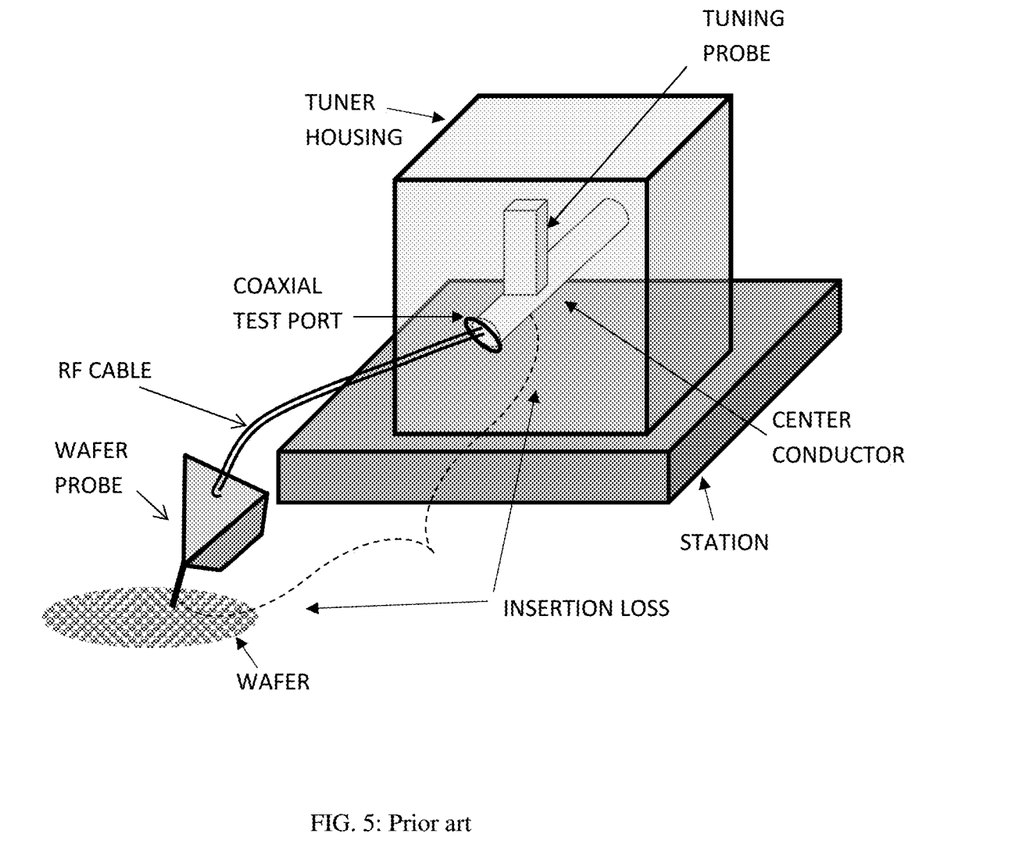
FIG. 5 depicts prior art, causes of insertion loss in an on-wafer test setup using impedance tuners.

The major tuning range limitations of test setups using passive slide screw tuners are: (a) the insertion loss shown in FIG. 1 as items 10 and 11 and, in a more specific but typical millimeter-wave on-wafer configuration, as shown in FIG. 5, the insertion loss between the tuner test port and the DUT, which insertion loss, in both cases, reduces the effective tuning range of the tuner (FIG. 3); (b) the mechanical conflict created by the length (height) of the precise vertical axis 21 and vertical motor 27 of the high profile tuner body with the microscope and by that the limitation in proximity of the tuner to the wafer probe. The high precision vertical axis of the tuner of FIG. 2 requires a minimum engagement length of the axis screw inside the carriage body for wobble-free operation, which necessitates a minimum vertical travel (height). This height (HEIGHT-1), typically 5.7" or approximately 145 mm (see ref. 10), creates the conflict with the microscope when using standard tuners as shown in FIG. 2 in the CONFLICT area shown in FIG. 6. To avoid this conflict, one needs a low-profile tuner, which is incompatible with long vertical axis, possible only when using low profile housing comprising extra-small footprint stepper motors down to 20×20 mm (see ref. 9) and rotating tuning probes (see ref. 8). We are comparing here a reduction in height of 145 to 20-25 mm or a factor of 7.

In this case the tuner must be constructed in a way to be mounted at a proper angle to allow direct in-line connection with the wafer probe without any interfering (and lossy) parts, like RF cables or adapters.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

Figure 7:
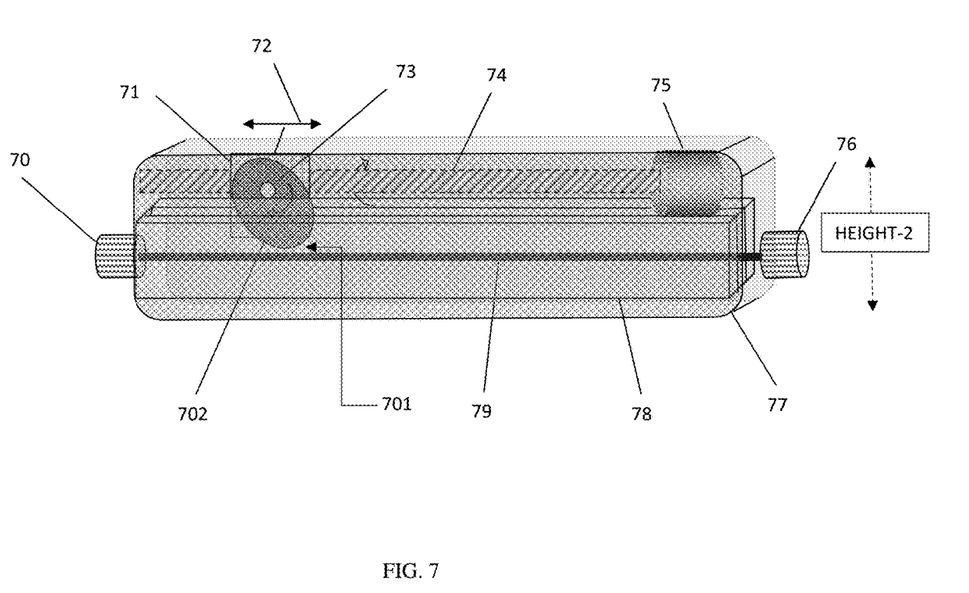
FIG. 7 depicts a front view of the structure of the low-profile tuner using rotating tuning probe.
Figure 8:
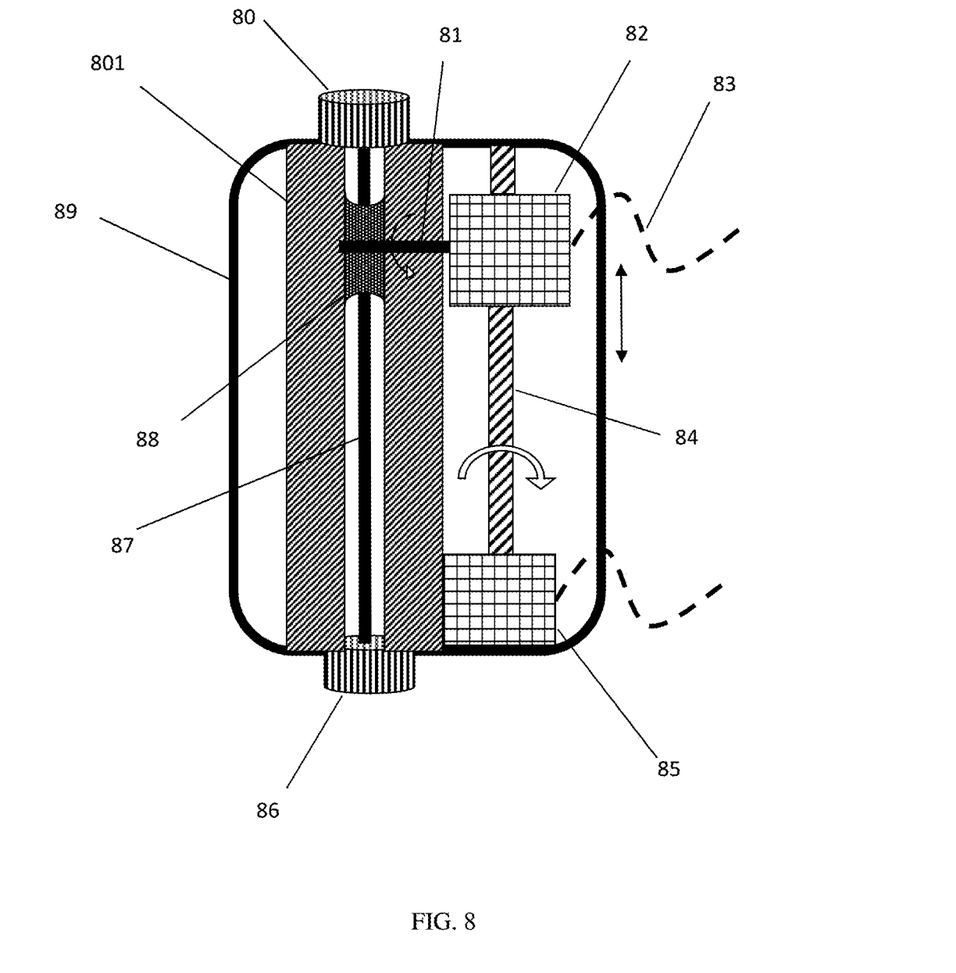
FIG. 8 depicts a top view of the low-profile tuner using rotating tuning probe.
Figure 9:
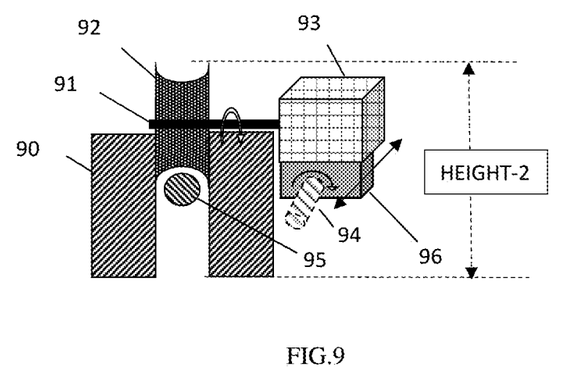
FIG. 9 depicts a cross section view of the low-profile tuner using rotating tuning probe.

The new tuner structure is shown in FIGS. 7, 8 and 9. In the slightly perspective front view of FIG. 7 we see the test port 70, the idle port 76 coaxial connectors mounted directly on the center conductor 79 and in-line with the axis of the slabline 78. It is important to eliminate any adapter or center conductor bending, which would create additional insertion loss. The vertical motor 71 acts as a support carriage of the eccentric tuning probe-disc 702, which, when rotated around the axis 73 clockwise approaches at area 701 the center conductor 79 and creates a wideband controllable reflection factor. The motor-carriage 71 is controlled horizontally 72 by a gear in form of an ACME rod 74, or a belt or a rack-and-pinion mechanism, which is controlled by a horizontal motor 75. Both motors have small facial footprint and draw their strength from larger depth (see ref. 9) the whole tuner mechanics is encapsulated in a compact solid housing 77.

FIG. 8 shows a top view of the interior mechanism of the low-profile tuner. The tuner uses a single wideband probe controlled by axis 81, and is, in this embodiment not harmonic (see ref. 5). The test 80 and idle 86 port connectors are attached directly to and aligned with the center conductor 87 of the slabline 801 for minimum residual reflection and insertion loss. The disc-formed tuning probe 88 having a concave periphery matching the diameter of the center conductor 87 is controlled and rotates eccentrically by the axis 84, which is attached or is identical with the rotor axis of the remotely controlled 83 vertical motor 82. An attachment, 96 in FIG. 9, to the vertical motor 82, 93 is traversed by the ACME rod 84, 94 and moved along the slabline. The ACME is controlled by the horizontal motor 85 which is also remotely controlled. Or, motor 85 controls the phase and motor 82 controls the amplitude of the reflection factor. The tuner is entirely embedded in a compact solid housing 89.

Figure 6:
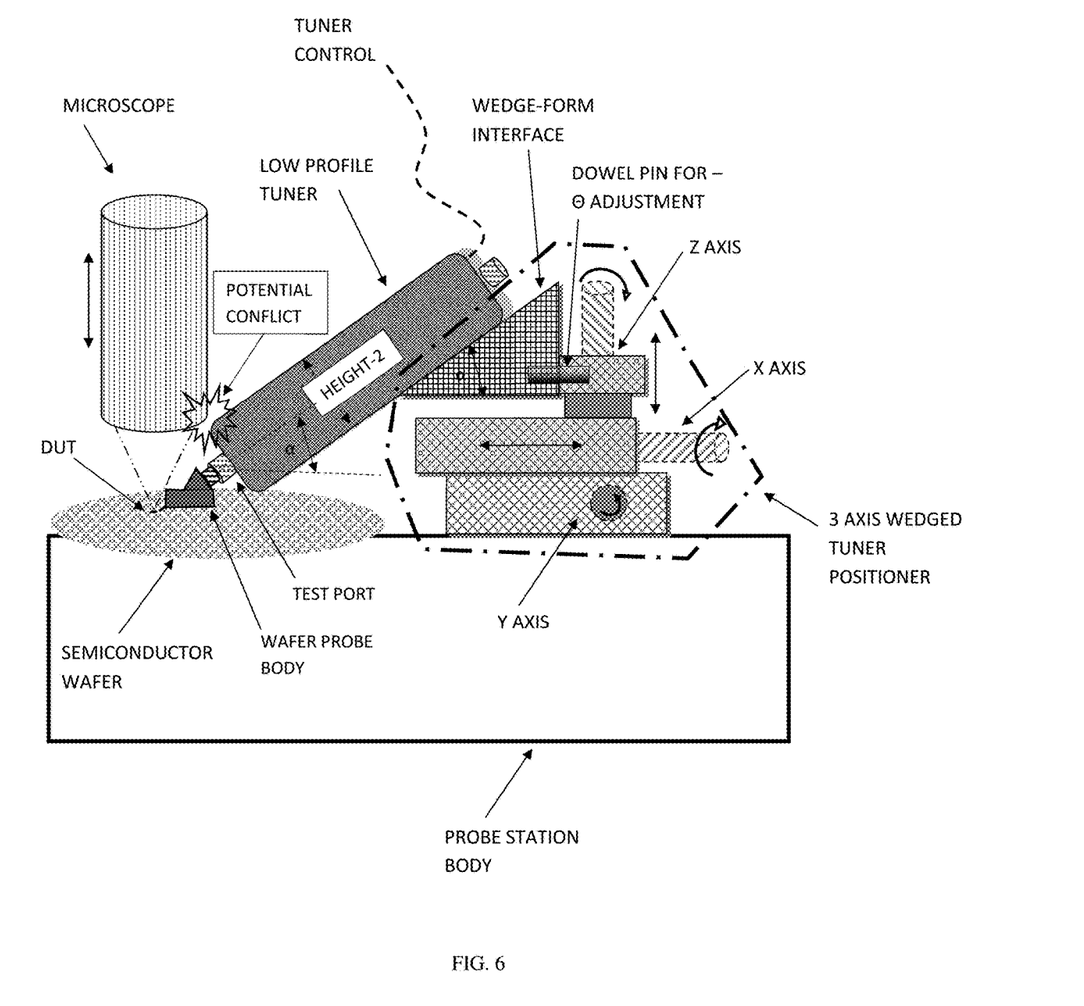
FIG. 6 depicts mounting a low-profile tuner on a wafer probe station indicating the potential mechanical conflict with the microscope.

FIG. 9 depicts the cross section of the tuner. The disc-probe 92 rotates around the axis 91 in and out of the slabline 90 approaching or withdrawing from the center conductor 95. The rotation angle and amplitude of the reflection factor is controlled by motor 93, which is mounted on a support block 96 traversed by the ACME 94. The assembly block 96, motor 93 and axis 91 control the position of the probe 92 along the slabline and by that the phase of the reflection factor. In all cases the height of the tuner HEIGHT-2 is minimized and much smaller than the height of a prior art tuner HEIGHT-1 in FIG. 2 to allow for the least conflict with the microscope when attached directly to the wafer probe as shown in FIG. 6.

The mounting method of tuners on wafer test stations has been described before (see ref. 6). The mounting of the low-profile tuner for maximum tuning range is shown in FIG. 6: The three-axis (tuner) positioner assembly comprises a stack of three linear sliders, each controlled by a micrometric screw, because the microscopic size of the chips on the semiconductor wafer requires extreme accuracy and movement resolution. The typical chip has a size of 0.5×0.5 $mm^2$ or smaller and the electric input and output contacts are spaced typically 150 µm apart. The vertical axis carries a wedge-formed interface block which ensures holding the low-profile tuner at the appropriate angle α, dictated by the wafer probe (see ref. 7). Such probes are typically available with coaxial connectors exiting the wafer probe body at α=30, 45 or 90 degrees. The present mounting method does support only 30- and 45-degree probes. 30-degree probes allow for higher margin between tuner body and microscope whereas 45-degree probes allow for shorter transition length and distance between the tuner body and the wafer surface. A variant of the three-axis positioner allows also for adjusting the wafer tip orientation (Θ—Theta adjustment). This is an optional accessory to wafer probe assemblies and can be introduced either on the positioner or the attachment to the wafer probe body. If introduced on the positioner, then the wedge-form interface shall rotate slightly at the interface with the z-axis using a dowel pin junction. To change wafer-probe angle one need only replace the wedge-form interface.

Obvious alternative embodiments to the herein disclosed low profile electromechanical coaxial slide screw tuners, which use rotating probes and the method of mounting the tuners on probe stations for maximizing the tuning range, suitable in the millimeter-wave frequency range, are imaginable and possible, but shall not impede on the validity of the basic idea of the present invention.

What I claim as my invention is:

1. A load pull test setup for measuring RF transistor chips on wafer, comprising:
    a low-profile electro-mechanical load pull tuner,
    a wafer probe station with wafer probes,
    a 3-axis tuner positioner with wedge interface;
wherein
    the low-profile electromechanical load pull tuner comprises:
        a low loss slabline having a center conductor, a longitudinal slot with a longitudinal axis, a coaxial test port and a coaxial idle port,
        at least one metallic tuning probe, movable along and insertable into the slot of the slabline;
    the wafer probe station comprises:
        a station platform with support of a semiconductor wafer,
        a microscope,
        a set of wafer probes having a body and a coaxial connector attached to the body with a slope of an angle Φ;
    the 3-axis tuner positioner with wedge interface comprises:
        a 3-axis (X-Y-Z) positioner mounted on the platform of the wafer probe station, and
        a wedge interface connecting the electro-mechanical load pull tuner with the 3-axis positioner,
        wherein
            the wedge interface has an inclined surface matching the angle Φ of the coaxial connector of the wafer probe,
and wherein
    the test port of the electromechanical load pull tuner is connected directly with the coaxial connector of the wafer probe.

2. The low-profile electromechanical load pull tuner of claim 1
    wherein
        the tuning probe is a metallic disc, which rotates eccentrically around an axis perpendicular to the longitudinal axis of the slabline and is moved along the slabline by a first, remotely controlled, stepper motor and gear and is rotated by a second, remotely controlled, stepper motor and gear,
    and wherein
        the electro-mechanical load pull tuner is encapsulated inside a solid, low-profile tuner enclosure.

3. The 3-axis tuner positioner with wedge interface of claim 1 having
    an X-axis parallel to the slabline, a Y-axis perpendicular to the slabline and a vertical Z-axis,
    each said axis being controlled manually using micrometric screws, and
    a wedge-form interface adapter attached to the vertical axis of the positioner and to the enclosure of the impedance tuner,
wherein
    the wedge-form interface adapter can be rotated against the vertical axis.

4. A method for establishing direct RF contact between the low-profile electro-mechanical load pull tuner and the wafer probe of claim 1,
    wherein
        the coaxial connector of the tuner test port is aligned with and connected directly to the coaxial connector of the wafer probe.

5. The low-profile electromechanical load pull tuner of claim 2,
    wherein
        the tuning probe is placed close to the test port.

* * * * *